(12) United States Patent
Mills

(10) Patent No.: US 9,155,234 B2
(45) Date of Patent: Oct. 6, 2015

(54) FORMED SHIELDING FEATURE

(75) Inventor: Brent Mills, Alpharetta, GA (US)

(73) Assignee: ARRIS Enterprises, Inc., Suwanee, GA (US)

( * ) Notice: Subject to any disclaimer, the term of this patent is extended or adjusted under 35 U.S.C. 154(b) by 563 days.

(21) Appl. No.: 13/547,179

(22) Filed: Jul. 12, 2012

(65) Prior Publication Data

US 2013/0023132 A1 Jan. 24, 2013

Related U.S. Application Data

(63) Continuation of application No. 12/193,630, filed on Aug. 18, 2008, now Pat. No. 8,259,457.

(60) Provisional application No. 60/956,167, filed on Aug. 16, 2007.

(51) Int. Cl.
*H05K 9/00* (2006.01)

(52) U.S. Cl.
CPC ...................................... *H05K 9/006* (2013.01)

(58) Field of Classification Search
CPC . A61B 5/04282; H04B 10/08; G08B 21/0446
USPC ......... 361/719, 749–750, 760–791, 796–804, 361/807–812, 816–818, 825–828; 174/254–258, 350, 395, 50.59, 104; 439/87–91, 126, 497, 607.01–607.59, 439/620.1, 620.19, 329, 591, 630, 631, 632, 439/636, 876
See application file for complete search history.

(56) References Cited

U.S. PATENT DOCUMENTS

| 6,373,711 B2 * | 4/2002 | Yamauchi et al. ............ 361/752 |
| 2002/0046879 A1 * | 4/2002 | Barabash ...................... 174/258 |

* cited by examiner

*Primary Examiner* — Jerry Wu
(74) *Attorney, Agent, or Firm* — Troy A. Van Aacken

(57) ABSTRACT

An electrical device, includes electrical pins that protrude from an enclosing metal housing. A compressible protrusion around the pins is formed out of the material of the metal housing. The protrusion is formed such that (1) an EMI shield does not exist around the pins when the pins are not engaged to an electrical coupler, and (2) the EMI shield is formed around the electrical pins when the protrusion is compressed by an electrical coupler engaging the electrical pins.

20 Claims, 5 Drawing Sheets

FORMED SHIELDING FEATURE

PRIORITY CLAIM

This application claims priority under 35 USC 119 to USA provisional application No. 60/956,167 filed on Thursday, Aug. 16, 2007, which is incorporated herein by reference.

BACKGROUND

Typically, when a diplexer or other electrical device is mounted to a printed circuit board, there is an area beneath the component, above the printed circuit board, where the device signal pins are exposed to electromagnetic interference (EMI). These EMI emissions may have an adverse effect on signal quality, signal to noise ratio, and the degree of filtering that must be applied. Reducing the impact of such emissions in a cost-effective manner is thus a desirable goal.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
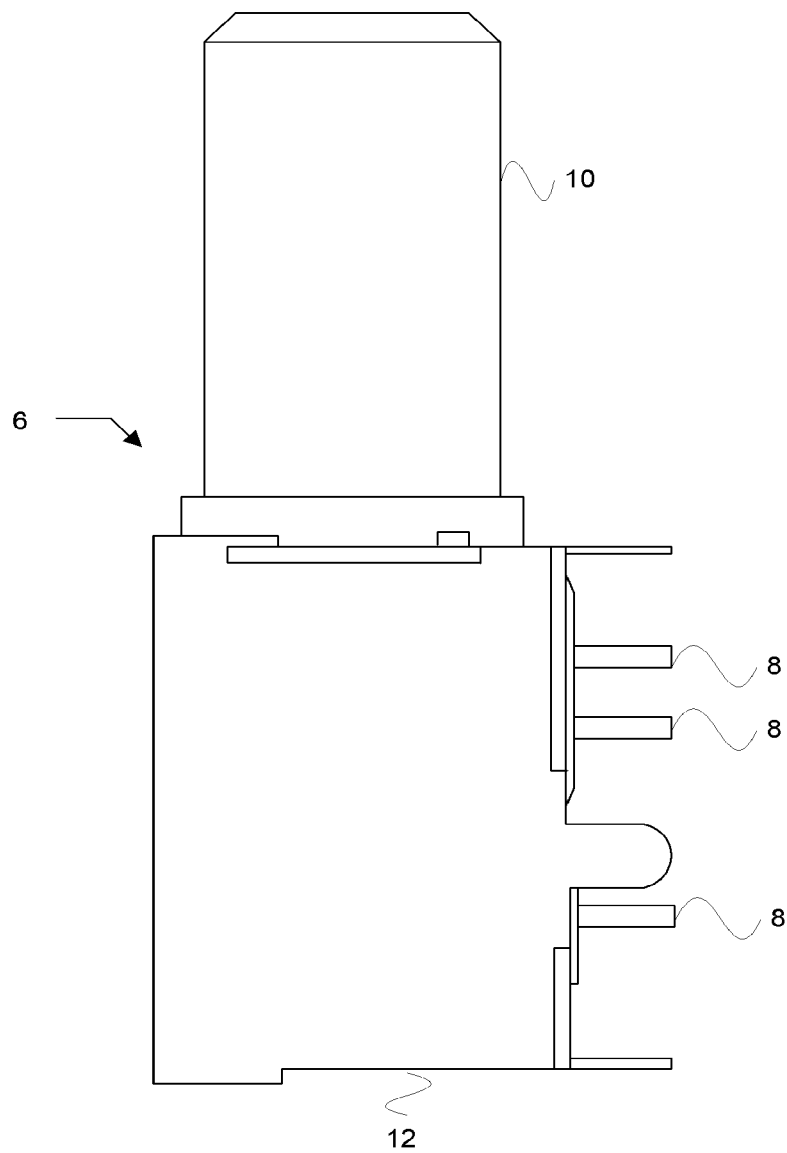
FIGS. 1 and 2 are illustrations of an embodiment of a diplexer device.
Figure 2:
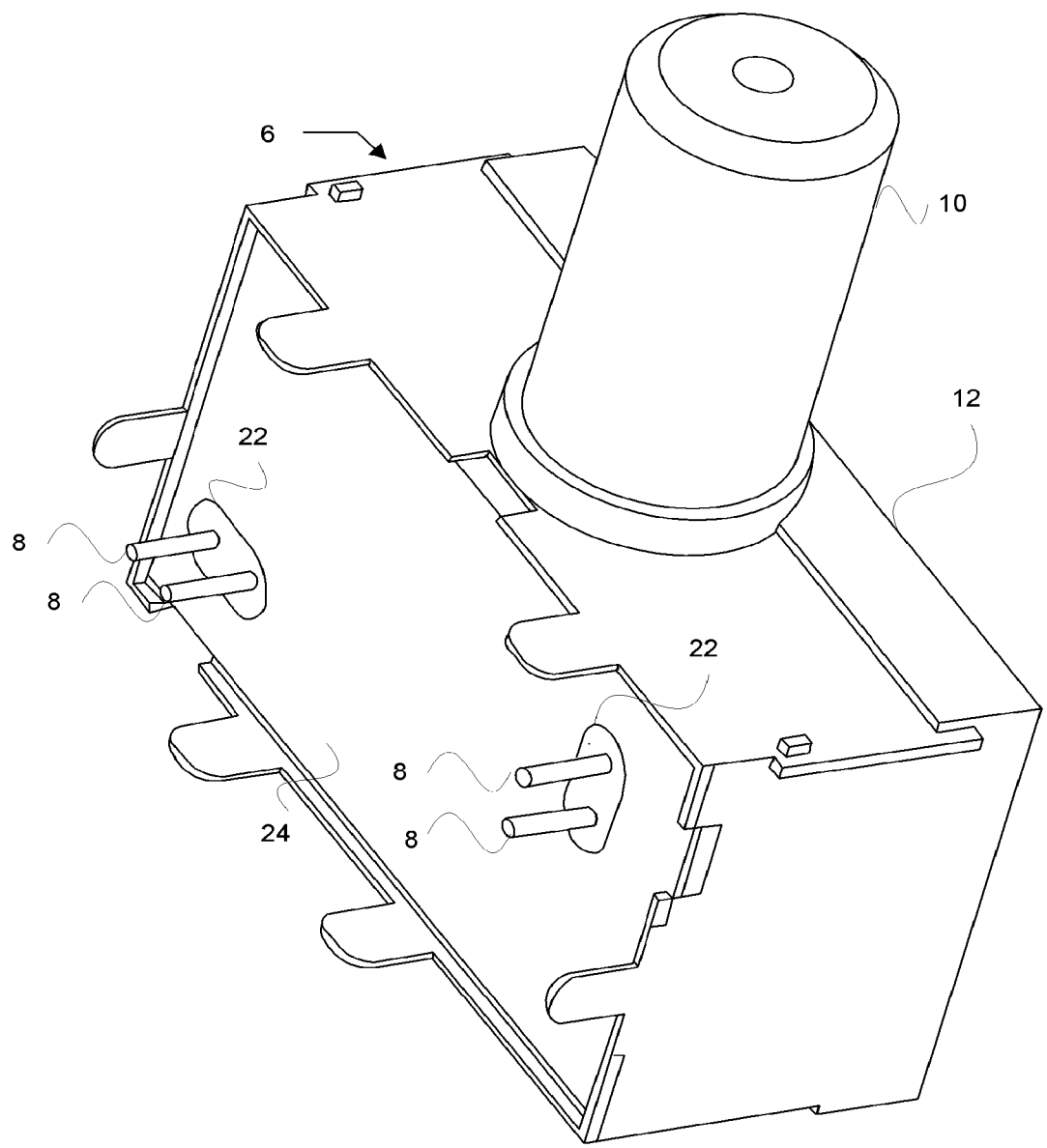

FIGS. 1 and 2 are illustrations of an embodiment of a diplexer device 6. A diplexer is typically a passive device that may implement frequency domain multiplexing of electrical signals. A diplexer typically comprises two ports. The diplexer may multiplex these two ports to a third port. Although the preferred embodiment herein is discussed in terms of a diplexer, those skilled in the art will appreciate that the described techniques and devices are also applicable to other circuits, such as but not limited to triplexers, quadplexers, and EMI-sensitive circuits in general. A combiner or splitter may also be employed to similar effect as a diplexer.

Figure 3:
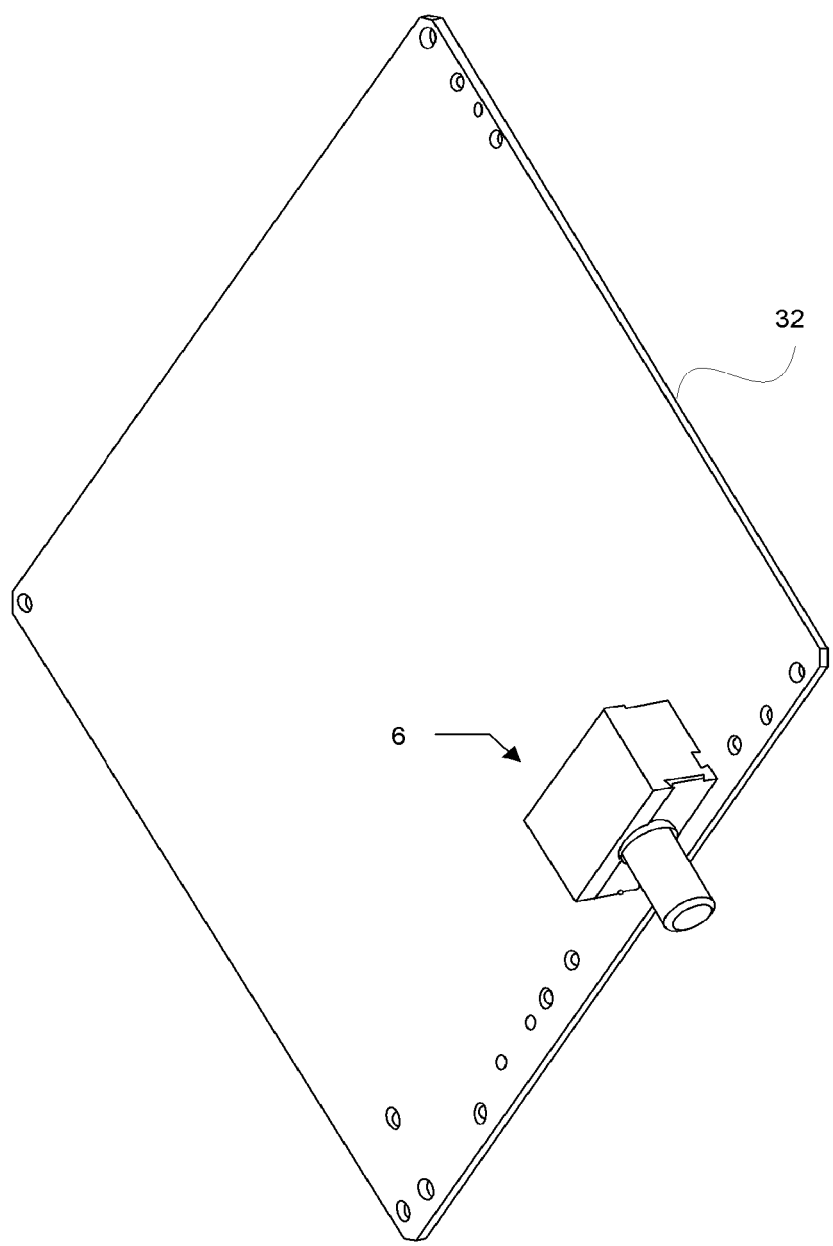
FIG. 3 is an illustration of the diplexer device embodiment of FIGS. 1 and 2 as it might be mounted on a printed circuit board.

The diplexer 6 comprises a metal housing 12 from which protrudes pins 8 of the diplexer component(s) within. The diplexer 6 may further comprise a coaxial F connector port 10. Pads 22 at the bases of the pins 8 do not include a formed shielding feature, and are thus flat and prone to ingress by EMI signals when the diplexer 6 is mounted on a circuit board. FIG. 3 is an illustration of the dipole device embodiment of FIGS. 1 and 2 as it might be mounted on a printed circuit board. The underside 24 of the diplexer housing 12 is located near the circuit board 32, but because the bases 22 of the pins 8 are not formed, EMI signals may impinge upon the pins 8.

Figure 4:
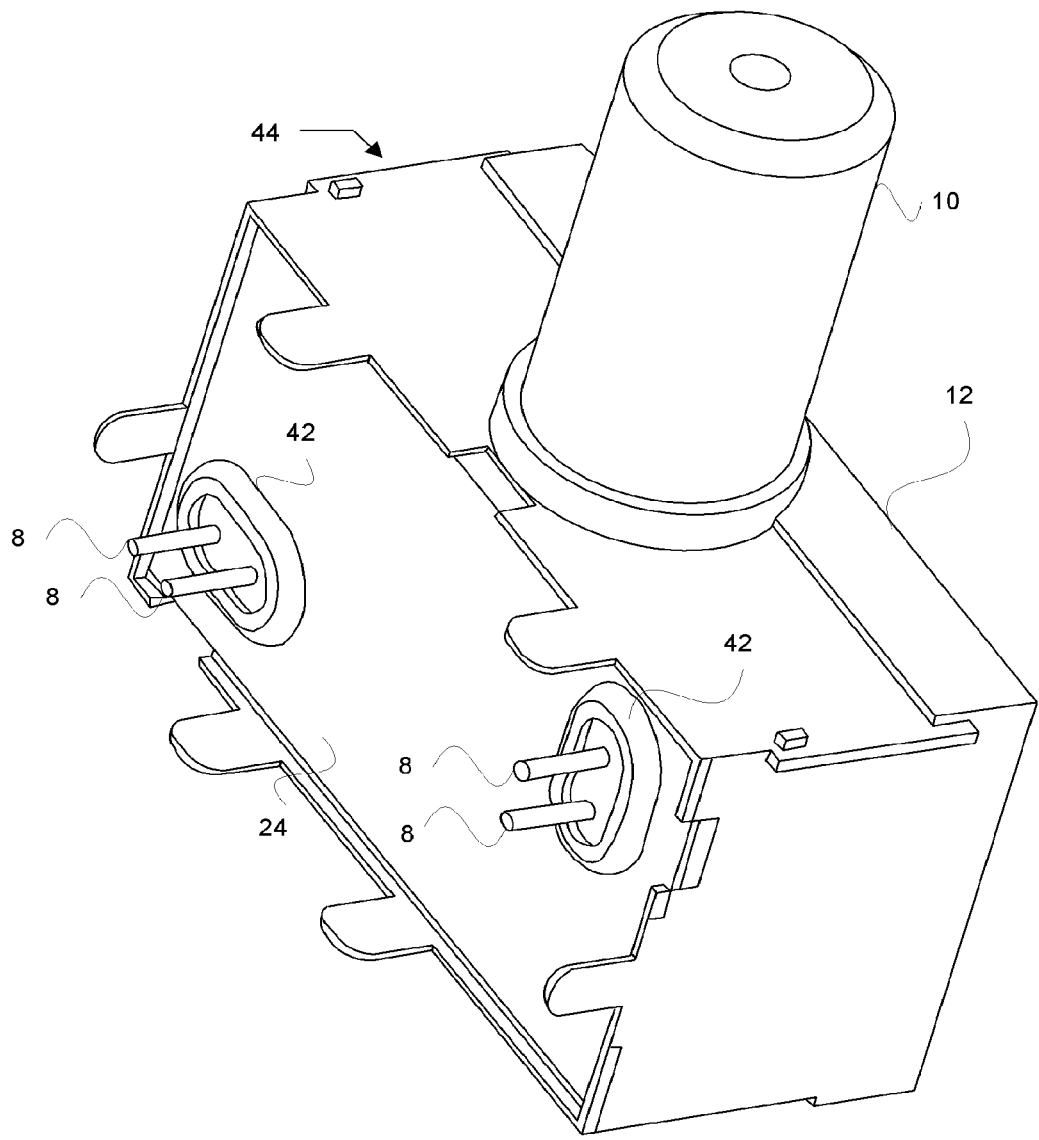
FIGS. 4 and 5 are illustrations of embodiments of a diplexer device with a formed electromagnetic shielding feature.
Figure 5:
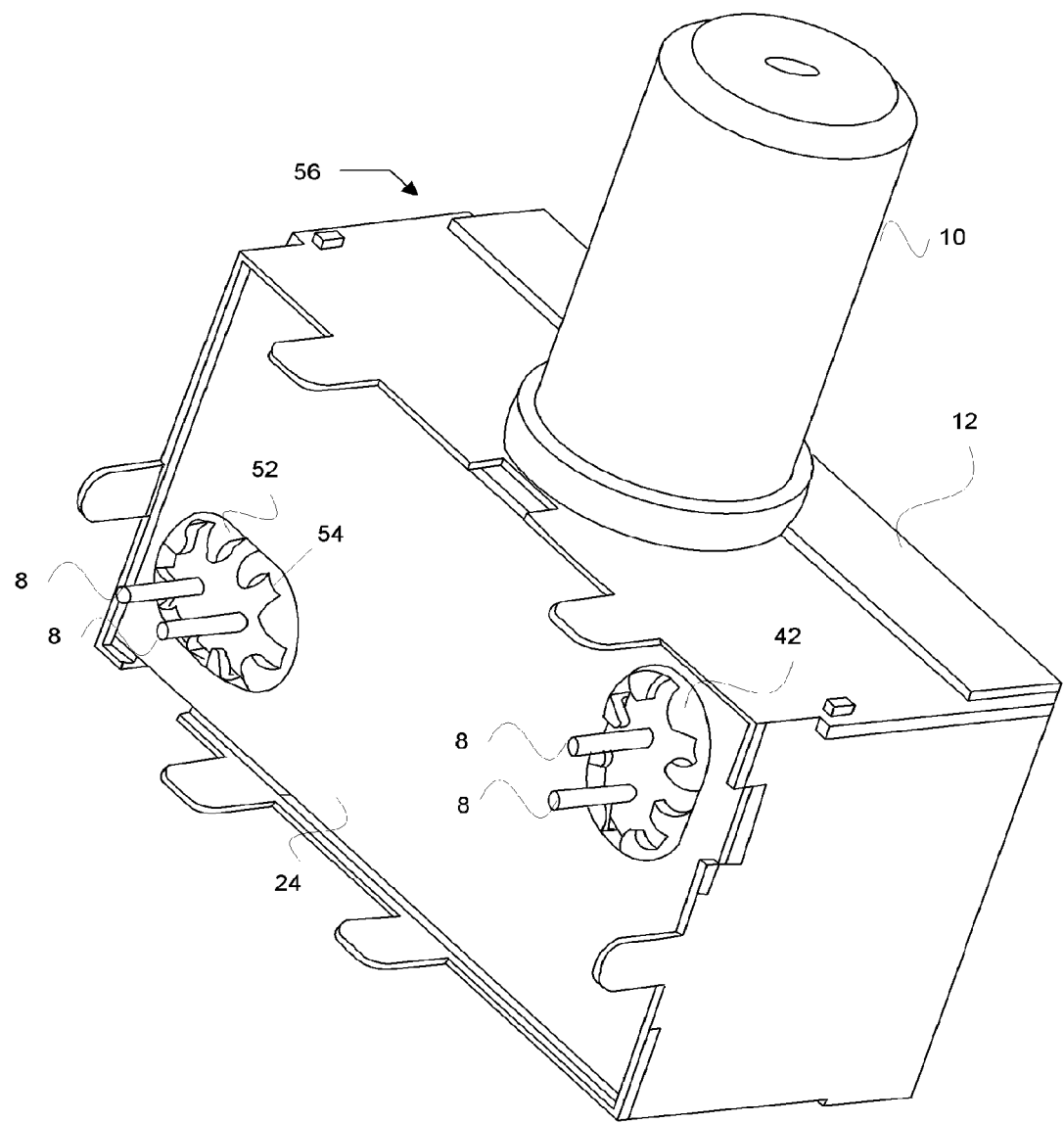

FIGS. 4 and 5 are illustrations of embodiments of a diplexer device 44 with a formed electromagnetic shielding feature. A formed shielding feature 42 added to the sheet metal underside 24 of the radio frequency diplexer component 44 shields the device signal pins 8 from spurious electromagnetic emissions. The formed shielding 42 is typically compressive with the sheet metal or ground pad of a printed circuit board 32 onto which the diplexer 44 is mounted.

Typically, when a diplexer 6 such as the one described in conjunction with FIGS. 1 and 2 component is mounted to a printed circuit board 32, there is an area beneath the component, above the printed circuit board 32, where the device signal pins 8 are exposed to electromagnetic emissions. Depending on the diplexer application, measures are sometimes taken to isolate this portion from spurious electromagnetic emissions so that emissions do not impinge on the pins 8. Typically the sheet metal side walls of the device could be extended to the printed circuit board and soldered to offer protection from emissions. Alternatively external shielding could be applied below the diplexer in the region around the device signal pins. A more cost effective approach is to form the sheet metal underside 24 of the diplexer 44 such that the shielding feature 42 extends to the surface of the printed circuit board 32. The portions of the pins 8 that may be exposed below the circuit board 32 may also be shielded in some applications.

The formed shielding feature 42 compresses against a ground pad on the printed circuit board 32 during the device assembly to shield the pins 8 from emissions. When the formed feature 42 contacts the ground layer of the printed circuit board 32, a faraday cage is created around the signal pins 8. To adjust the force required for compression, the formed shield may be either continuous or a set of discontinuous fingers 52, as shown for example in FIG. 5. The width of gaps 54 between the fingers 52 is preferably less than the wavelength of the highest anticipated frequency handled by the diplexer device 56.

Although illustrated as ovals, the formed features 42, 52 may comprise other geometries as well, including circles, rectangles, multisided shapes, and combinations thereof.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. An electrical device, comprising: electrical pins that protrude through a metal sidewall of an enclosure; and a compressible protrusion around electrical pins formed out of metal of the metal sidewall, the compressible protrusion formed such that (a) an EMI shield does not exist around the electrical pins when the electrical pins are not engaged to an electrical coupler, and (b) the EMI shield is formed around the electrical pins when the compressible protrusion is compressed by the electrical coupler engaging the electrical pins; and bending the compressible protrusion inwardly toward the electrical pins.

2. The electrical device of claim 1, further comprising:
at least one diplexer device enclosed within the enclosure.

3. The electrical device of claim 1, further comprising:
the electrical pins comprising at least one coaxial cable connector.

4. The electrical device of claim 1, further comprising:
the enclosure formed with a continuous compressible protrusion around the electrical pins.

5. The electrical device of claim 1, further comprising:
the enclosure formed with a discontinuous compressible protrusion around the electrical pins.

6. The electrical device of claim 5, further comprising:
the discontinuous compressible protrusion comprising fingers of metal formed from the metal of the metal sidewall.

7. The electrical device of claim 6, further comprising:
the fingers of metal spaced apart by less than a wavelength of a highest frequency signal to be handled by the electrical device.

8. An electrical device, comprising:
a printed circuit board comprising electrical pins that protrude through sidewall metal of an enclosure sidewall of an enclosure of the printed circuit board; and
a compressible protrusion around the electrical pins formed out of the sidewall metal of the enclosure of the printed circuit board, the compressible protrusion formed such that (a) an EMI shield does not exist around the electrical pins when the electrical pins are not engaged to an electrical coupler, and (b) the EMI shield is formed from the compressible protrusion around the electrical pins when the compressible protrusion is compressed into contact with a ground pad of the printed circuit board by the electrical coupler engaging the electrical pins; and bending the compressible protrusion inwardly toward the electrical pins.

9. The printed circuit board of claim 8, further comprising:
at least one diplexer device.

10. The printed circuit board of claim 8, further comprising:
at least one coaxial cable connector.

11. The printed circuit board of claim 8, further comprising:
the sidewall metal formed into a continuous compressible protrusion around the electrical pins.

12. The printed circuit board of claim 8, further comprising:
the sidewall metal formed into a discontinuous compressible protrusion around the electrical pins.

13. The printed circuit board of claim 12, further comprising:
the discontinuous compressible protrusion comprising fingers of metal.

14. The printed circuit board of claim 13, further comprising:
the fingers of metal spaced apart by less than a wavelength of a highest frequency signal to be handled by the electrical device.

15. A communication network component, comprising: a printed circuit board having an electrical device mounted thereon, the electrical device having electrical pins that protrude through a metal sidewall of an enclosure of the printed circuit board; and a compressible protrusion around the electrical pins formed out of the metal sidewall, the compressible protrusion formed such that (a) an EMI shield does not exist around the electrical pins when the electrical pins are not engaged to an electrical coupler, and (b) the EMI shield is formed by the compressible protrusion around the electrical pins when the compressible protrusion is compressed into contact with a ground pad of the printed circuit board by the electrical coupler engaging the electrical pins; and bending the compressible protrusion inwardly toward the electrical pins.

16. The communication network component of claim 15, further comprising:
at least one coaxial cable connector.

17. The communication network component of claim 15, further comprising:
the metal sidewall formed into a continuous compressible protrusion around the electrical pins.

18. The communication network component of claim 15, further comprising:
the metal sidewall formed into a discontinuous compressible protrusion around the electrical pins.

19. The communication network component of claim 18, further comprising:
the discontinuous compressible protrusion comprising fingers of metal.

20. The communication network component of claim 19, further comprising:
the fingers of metal spaced apart by less than a wavelength of a highest frequency signal to be handled by the electrical device.

* * * * *